United States Patent
Ariga et al.

(10) Patent No.: US 9,153,779 B2
(45) Date of Patent: Oct. 6, 2015

(54) RESISTANCE CHANGE MEMORY ELEMENT AND RESISTANCE CHANGE MEMORY

(71) Applicant: KABUSHIKI KAISHA TOSHIBA, Tokyo (JP)

(72) Inventors: Tomotaka Ariga, Mie-ken (JP); Junichi Wada, Mie-ken (JP); Kouji Matsuo, Aichi-ken (JP); Noritake Oomachi, Tokyo (JP); Yoshio Ozawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/022,478

(22) Filed: Sep. 10, 2013

(65) Prior Publication Data

US 2014/0284546 A1 Sep. 25, 2014

Related U.S. Application Data

(60) Provisional application No. 61/804,347, filed on Mar. 22, 2013.

(51) Int. Cl.
*H01L 45/00* (2006.01)
*H01L 27/24* (2006.01)
*G11C 13/00* (2006.01)

(52) U.S. Cl.
CPC .......... *H01L 45/146* (2013.01); *G11C 13/0007* (2013.01); *H01L 27/2409* (2013.01); *H01L 27/2436* (2013.01); *H01L 27/2481* (2013.01); *H01L 45/08* (2013.01); *H01L 45/1233* (2013.01); *H01L 45/1625* (2013.01); *G11C 2213/34* (2013.01)

(58) Field of Classification Search
None
See application file for complete search history.

(56) References Cited

U.S. PATENT DOCUMENTS

| | | | |
|---|---|---|---|
| 7,061,013 B2* | 6/2006 | Hideki | 257/42 |
| 2004/0026682 A1* | 2/2004 | Jiang | 257/4 |
| 2009/0026434 A1 | 1/2009 | Malhotra et al. | |
| 2010/0006813 A1* | 1/2010 | Xi et al. | 257/4 |
| 2010/0044665 A1* | 2/2010 | Jedema | 257/2 |
| 2010/0237317 A1 | 9/2010 | Tsunoda | |
| 2010/0270528 A1* | 10/2010 | Yoo et al. | 257/3 |
| 2010/0314602 A1 | 12/2010 | Takano et al. | |
| 2011/0147891 A1* | 6/2011 | Furukawa et al. | 257/532 |
| 2012/0061638 A1 | 3/2012 | Kunikiyo et al. | |
| 2012/0068145 A1* | 3/2012 | Matsuo | 257/4 |
| 2013/0320285 A1* | 12/2013 | Zhou et al. | 257/2 |
| 2014/0091270 A1* | 4/2014 | Yang et al. | 257/4 |

FOREIGN PATENT DOCUMENTS

| | | |
|---|---|---|
| JP | 2010-40957 | 2/2010 |
| JP | 2011-216658 | 10/2011 |
| JP | 2012-69609 | 4/2012 |

\* cited by examiner

*Primary Examiner* — Andres Munoz
(74) *Attorney, Agent, or Firm* — Finnegan, Henderson, Farabow, Garrett & Dunner, L.L.P.

(57) ABSTRACT

According to one embodiment, a memory element includes: a first electrode layer; a second electrode layer; and a memory layer provided between the first electrode layer and the second electrode layer, and the memory layer including a plurality of first oxide layers in a second oxide layer, a resistivity of each of the plurality of first oxide layers being higher than a resistivity of the second oxide layer.

16 Claims, 9 Drawing Sheets

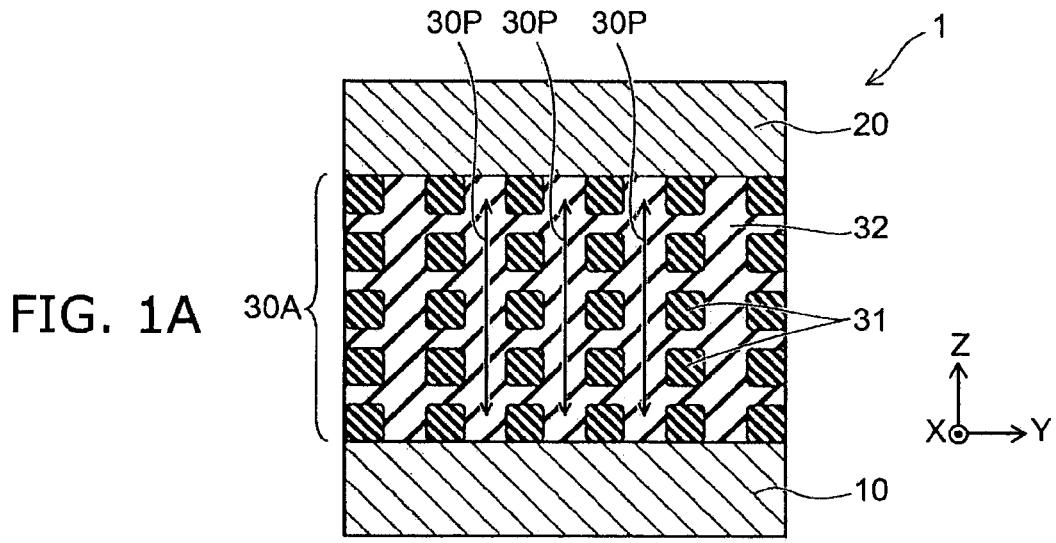
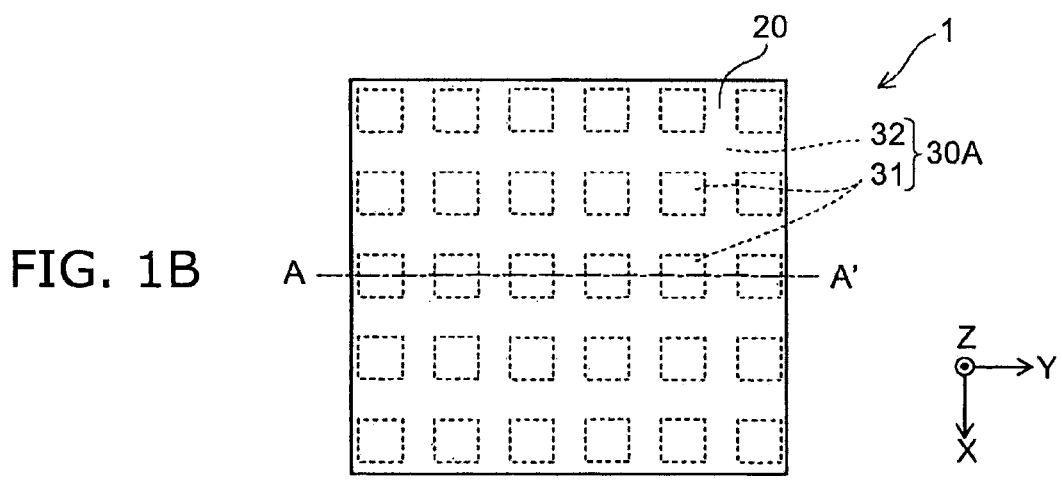
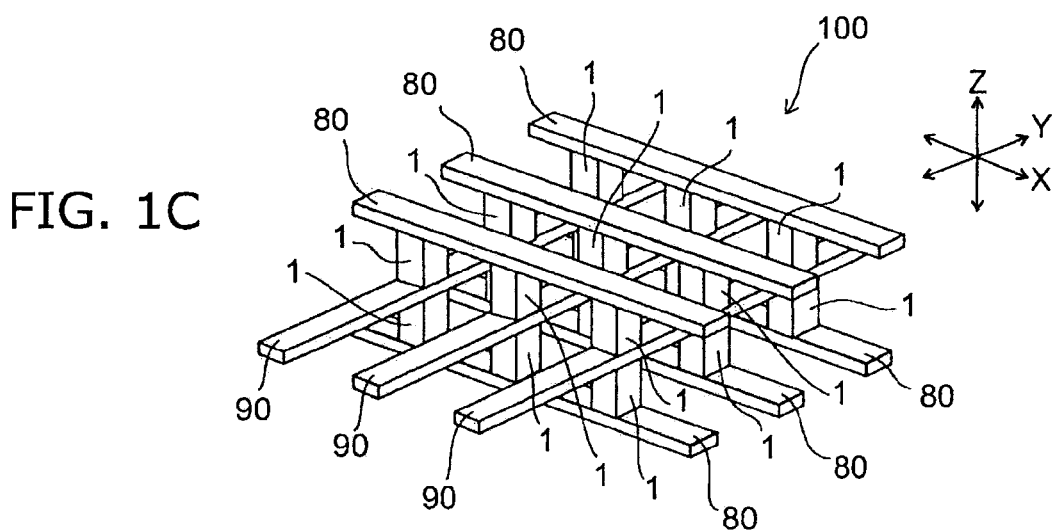

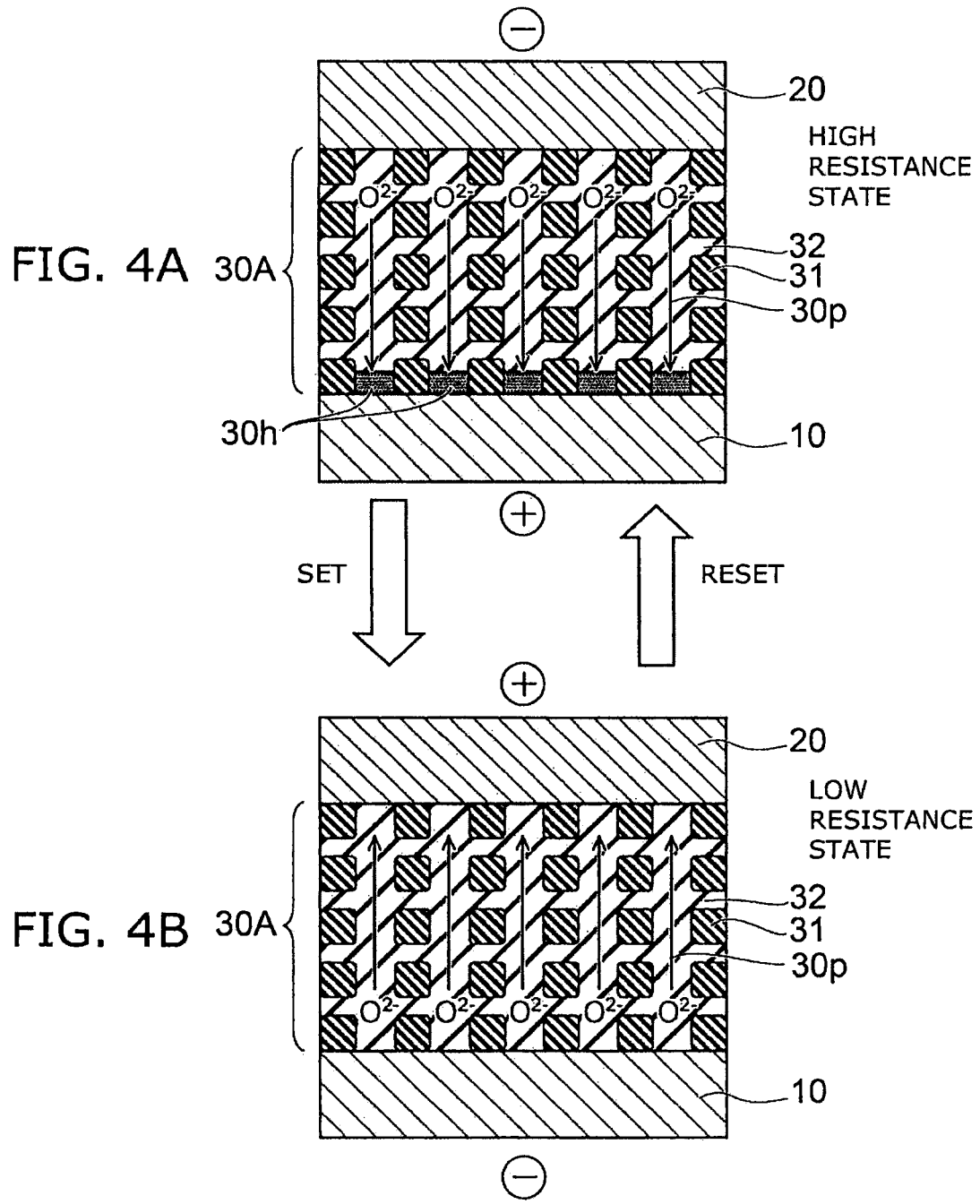

RESISTANCE CHANGE MEMORY ELEMENT AND RESISTANCE CHANGE MEMORY

CROSS-REFERENCE TO RELATED APPLICATIONS

This application is based upon and claims the benefit of priority from U.S. Provisional Patent Application No. 61/804,347, filed on Mar. 22, 2013; the entire contents of which are incorporated herein by reference.

FIELD

Embodiments described herein relate generally to a memory element.

BACKGROUND

Resistance change memories that store data based on the resistance state are researched and developed. The resistance change memory includes a memory layer of which the resistance can change between a low resistance state and a high resistance state. Data storing can be assigned data to the low resistance state and the high resistance state. Here, the memory layer can be switched between the low resistance state and the high resistance state by applying a voltage to electrodes formed at its both ends.

BRIEF DESCRIPTION OF THE DRAWINGS

FIG. 1A is an example of a schematic cross-sectional view showing a memory element according to a first embodiment, FIG. 1B is an example of a schematic plan view showing the memory element according to the first embodiment, and FIG. 1C shows an example of a cross-point memory cell array using the memory element according to the first embodiment;

FIG. 4A and FIG. 4B are examples of schematic cross-sectional views showing operations of the memory element according to the first embodiment;

DETAILED DESCRIPTION

Figure 2:
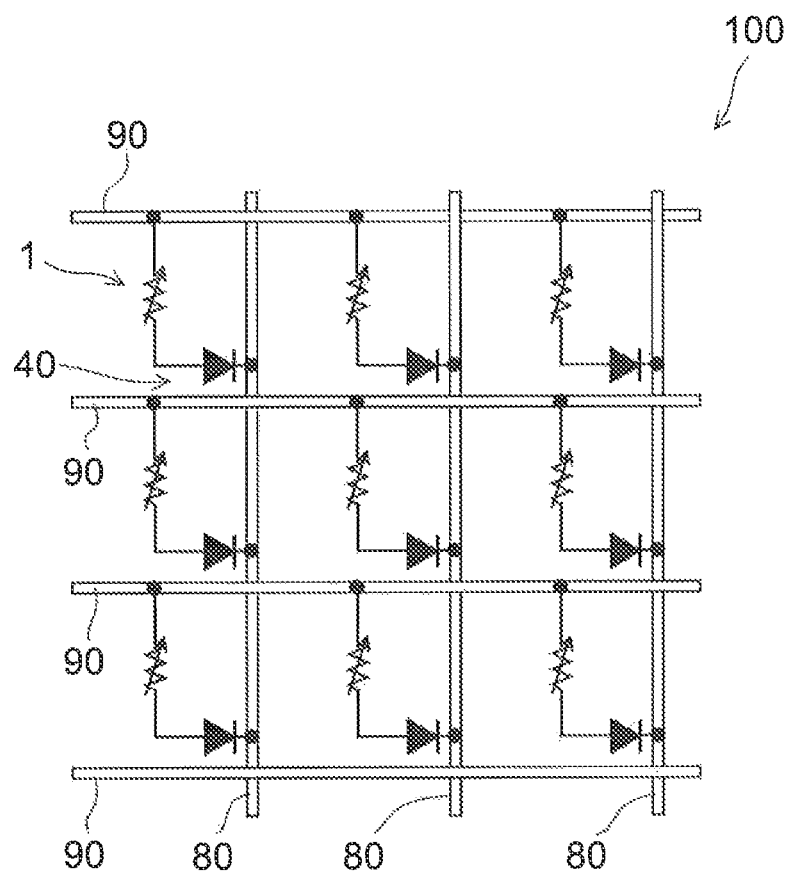
FIG. 2 is an example of a circuit diagram of a memory cell array of a memory device using the memory element according to the first embodiment.

According to one embodiment, a memory element includes: a first electrode layer; a second electrode layer; and a memory layer provided between the first electrode layer and the second electrode layer, and the memory layer including a plurality of first oxide layers in a second oxide layer, a resistivity of each of the plurality of first oxide layers being higher than a resistivity of the second oxide layer.

Hereinbelow, embodiments are described with reference to the drawings. In the following description, identical components are marked with the same reference numerals, and a description of components once described is omitted as appropriate.

First Embodiment

FIG. 1C shows an example of a cross-point memory cell array using a memory element 1. In FIG. 1C, two layers of memory cell arrays are shown as an example. A memory cell is provided at the intersection of each bit line 80 and each word line 90. Memory cells are arranged in a matrix configuration in the X direction (a first direction) and the Y direction (a second direction).

Each bit line 80 and each word line 90 contain a material containing a metal, having a high heat resistance, and having a low resistance value. For example, each bit line and each word line contain tungsten (W), titanium (Ti), tantalum (Ta), a nitride of these, a stacked structure of these, or the like.

FIG. 1A is an example of a schematic cross-sectional view showing a memory element according to a first embodiment, FIG. 1B is an example of a schematic plan view showing the memory element according to the first embodiment, and FIG. 1C shows an example of a cross-point memory cell array using the memory element according to the first embodiment.

FIG. 1A shows a cross section in the position of line A-A' of FIG. 1B.

The memory element 1 is, for example, a resistance change element of an interface oxidation type. The memory element 1 includes an electrode layer 10 (a first electrode layer), an electrode layer 20 (a second electrode layer), and a memory layer 30A. The memory layer 30A is provided between the electrode layer 10 and the electrode layer 20. The memory layer 30A includes a plurality of oxide layers 31 (first oxide layers) and an oxide layer 32 (a second oxide layer) provided between the plurality of oxide layers 31. The memory element may be referred to as a resistance change element. The memory layer may be referred to as a resistance change layer.

The plurality of oxide layers 31 are aligned in the Z direction (a first direction) from the electrode layer 10 toward the electrode layer 20, and are aligned via the oxide layer 32 in a direction (a second direction) crossing the Z direction. The direction crossing the Z direction is, for example, the X direction or the Y direction. The resistivity of each of the plurality of oxide layers 31 is higher than the resistivity of the oxide layer 32. That is, in the memory layer 30A, the plurality of oxide layers 31 that are more resistive than the oxide layer 32 are scattered three-dimensionally in the oxide layer 32. One of the plurality of oxide layers 31 is in contact with the electrode layer 10. Another of the plurality of the oxide layers 31 is disposed apart from the electrode layer 10.

Each of the oxide layers 31 and 32 is, for example, a metal oxide layer.

The oxide layer 31 or the oxide layer 32 contains an oxide of at least one element selected from the group consisting of hafnium (Hf), aluminum (Al), zirconium (Zr), titanium (Ti), silicon (Si), vanadium (V), tantalum (Ta), manganese (Mn), niobium (Nb), chromium (Cr), tungsten (W), molybdenum (Mo), cobalt (Co), nickel (Ni), and copper (Cu).

Each of the electrode layer 10 and the electrode layer 20 contains at least one element selected from the group consisting of tungsten (W), molybdenum (Mo), iron (Fe), cobalt (Co), nickel (Ni), copper (Cu), ruthenium (Ru), iridium (Ir), silver (Ag), and platinum (Pt).

In the plurality of oxide layers 31 and the oxide layer 32, the elements contained in the oxide layers 31 and 32 are selected so that the absolute value of the standard Gibbs free energy of formation of the oxide contained in each of the plurality of oxide layers 31 is larger than the absolute value of the standard Gibbs free energy of formation of the oxide contained in the oxide layer 32.

Alternatively, in the plurality of oxide layers 31 and the oxide layer 32, the elements contained in the oxide layers 31 and 32 are selected so that the absolute value of the standard Gibbs free energy of formation of the oxide contained in each of the plurality of oxide layers 31 is smaller than the absolute value of the standard Gibbs free energy of formation of the oxide contained in the oxide layer 32.

Here, the standard Gibbs free energy of formation of an oxide contained in an oxide layer A is expressed as $\Delta G_a$ (kJ/mol, 298.15 K). The standard Gibbs free energy of formation when a metal element contained in an oxide layer B changes to an oxide is expressed as $\Delta G_b$.

The oxide layer 32 has a composition deviated from the stoichiometric composition. The oxide layer 32 is a metal-rich oxide layer. The oxide layer 32 has a small electrical conductivity. In the memory element 1, as a result of the plurality of oxide layers 31 being scattered in the oxide layer 32, the oxide layer 32 is sandwiched by adjacent oxide layers 31. The region of the sandwiched oxide layer 32 forms a current path 30p. The current path 30p extends in the Z direction. The current path 30p is in contact with the electrode layers 10 and 20. In the memory element 1, a plurality of current paths 30p are provided between the electrode layer 10 and the electrode layer 20. The oxide layers 31 are not limited to the case of being arranged in a matrix configuration. The oxide layers 31 may be randomly arranged in the memory layer 30A. It is sufficient that at least the current flowing through the oxide layer 32 be limited by the existence of the oxide layer 31 and a current path be formed in the oxide layer 32 between oxide layers 31.

To suppress the oxidation of the electrode layers 10 and 20, the elements contained in the oxide layers 31 and 32 or the electrode layers 10 and 20 are selected so that the absolute value of the standard Gibbs free energy of formation of the oxide contained in the oxide layers 31 and 32 is larger than the absolute value of the standard Gibbs free energy of formation when the metal element contained in the electrode layers 10 and 20 changes to an oxide.

FIG. 1A shows a state where part of the plurality of oxide layers 31 are in contact with at least one of the electrode layer 10 and the electrode layer 20. The embodiment includes also a state where part of the plurality of oxide layers 31 are not in contact with at least one of the electrode layer 10 and the electrode layer 20.

FIG. 2 is an example of a circuit diagram of a memory cell array of a memory device using the memory element according to the first embodiment. Here, FIG. 2 shows a circuit diagram of a memory cell array 100 of only one stage in the Z direction. Actually the memory cell array 100 shown in FIG. 2 is stacked vertically and horizontally.

A voltage can be applied to the electrode layer 10 via the bit line 80, and a voltage can be applied to the electrode layer 20 via the word line 90. Here, the memory layer 30A can be given a potential difference of a polarity whereby the bit line 80 becomes a higher potential, and can be given a potential difference of a polarity whereby the word line 90 becomes a higher potential. That is, the memory element 1 can be used as a bipolar resistance change element.

In addition, the memory cell array 100 may include a selector 40. The selector 40 is provided between the memory element 1 and the bit line 80, for example. The selector includes a diode through which a current flows in one direction and a current does not flow in the opposite direction thereof and an element through which a current does not flow at or below a certain positive or negative threshold voltage and a current flows forward or backward upon exceeding the threshold voltage. For example, the selector 40 is a tunnel diode. The selector 40 may be also a field effect transistor, for example.

Figure 3A:
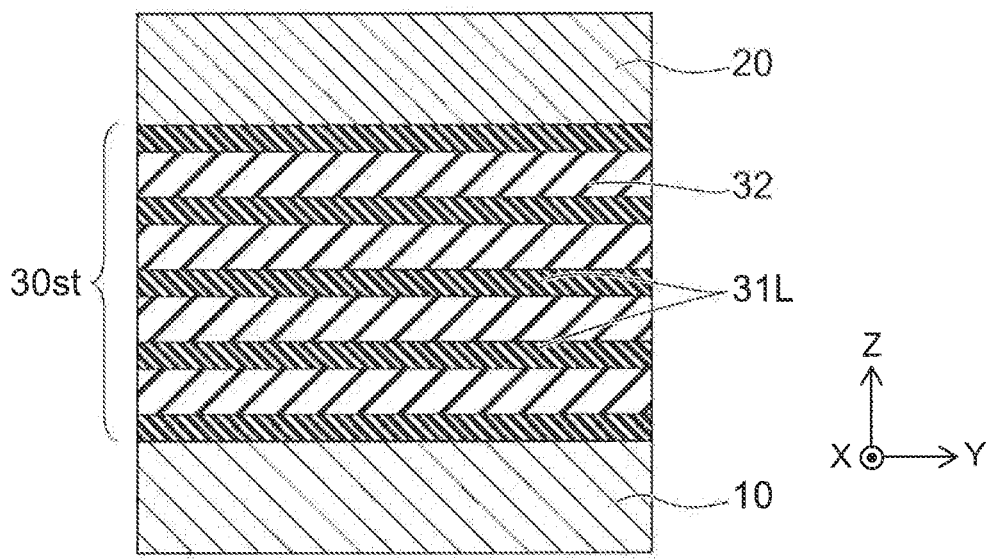
FIG. 3A and FIG. 3B are examples of schematic cross-sectional views showing a method for manufacturing a memory element according to the first embodiment.
Figure 3B:
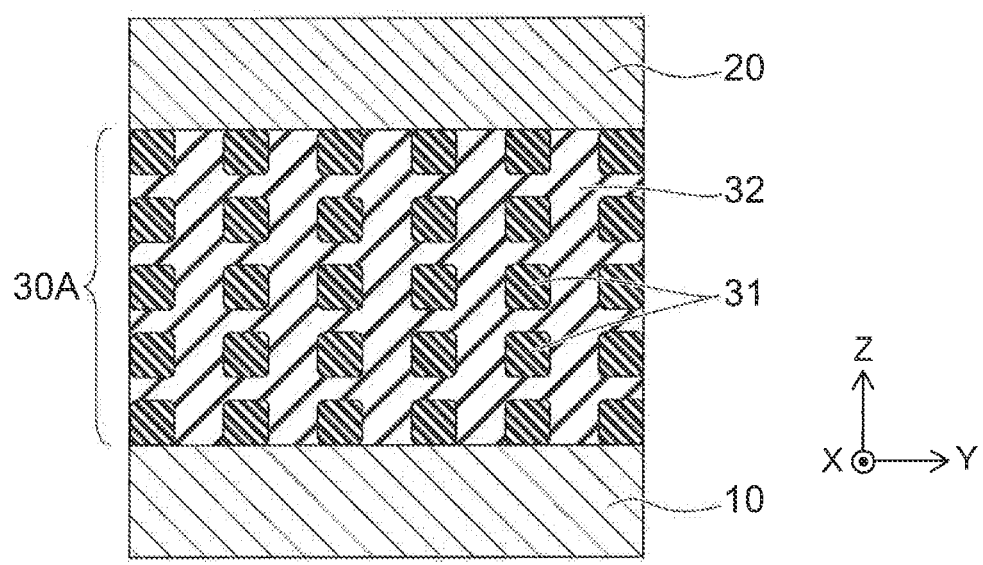

FIG. 3A and FIG. 3B are examples of schematic cross-sectional views showing a method for manufacturing a memory element according to the first embodiment.

First, as shown in FIG. 3A, a stacked body 30st in which an oxide layer 31L and the oxide layer 32 are alternately stacked is formed between the electrode layer 10 and the electrode layer 20. The components of the oxide layer 31L are the same as the components of the oxide layer 31.

The stacked body 30st is provided between the electrode layer 10 and the electrode layer 20 in such a manner that the oxide layer 31L that is high resistive is in contact with the electrode layer 10 or the electrode layer 20.

Next, heating treatment is performed on the stacked body 30st. When the stacked body 30st is heated, the aggregation effect of a coating occurs, and the plurality of oxide layers 31L are separated. Thereby, the oxide layer 32 is provided between a plurality of oxide layers 31.

Thus, the oxide layer 32 is in contact with the electrode layer 10 or the electrode layer 20 so as to be sandwiched by oxide layers 31. That is, the area with which the oxide layer 32 is in contact with the electrode layer 10 or the electrode layer 20 is smaller than the area with which the memory layer 30A is in contact with the electrode layer 10 or the electrode layer 20.

FIG. 4A and FIG. 4B are examples of schematic cross-sectional views showing operations of the memory element according to the first embodiment.

FIG. 4A shows a situation where the memory layer 30A is in a high resistance state, and FIG. 4B shows a situation where the memory layer 30A is in a low resistance state. In the memory element 1, by forming a high resistance region 30h and by eliminating the high resistance region 30h, the resistance can be changed to store information.

For example, as shown in FIG. 4A, a voltage is applied so that the electrode layer 10 becomes a higher potential. Due to the potential difference applied between the electrode layer 10 and the electrode layer 20, oxygen ions ($O^{2-}$) are generated in the oxide layer 32. Here, the current flows through the narrow region of the oxide layer 32 sandwiched by oxide layers 31. That is, Joule heat is efficiently generated in the oxide layer 32, and oxygen ions are produced in a large amount from the oxide layer 32.

The oxygen ions are minus ions, and therefore move to the side of the electrode layer 10, which is an anode. A voltage, which is at a level necessary for the movement of oxygen ions, is applied between the electrode layer 10 and the electrode layer 20.

Thereby, the reactivity between oxygen ions and the oxide layer 32 near the electrode layer 10 is enhanced, and the oxidation reaction of the oxide layer 32 near the electrode layer 10 is promoted. Here, near the electrode layer 10, the area with which the electrode layer 10 and the oxide layer 32 are in contact is smaller than the area with which the memory layer 30A is in contact with the electrode layer 10. This is because the electrode layer 10 and the oxide layer 31 are in contact. Consequently, in the oxide layer 32 of the electrode layer 10, a high resistance region 30h having a high oxygen concentration and a high resistance is formed. The electrons possessed by the oxygen ions flow to the electrode layer 10. The high resistance region 30h is an oxide layer of the stoichiometric composition or near the stoichiometric composition.

Here, when the high resistance region 30h is formed, it becomes difficult for a current to flow between the electrode layer 10 and the electrode layer 20. That is, the memory layer 30A is switched to a high resistance state.

As shown in FIG. 4B, a voltage is applied so that the electrode layer 10 becomes a lower potential. In this case, the electric field of the high resistance region 30h becomes strong in the memory layer 30A. This is because the resistivity of the high resistance region 30h is relatively high in the memory layer 30A. Therefore, oxygen ions are generated in a large amount in the high resistance region 30h.

The oxygen ions are diffused to the side of the electrode layer 20, which is an anode. Consequently, the oxygen concentration of the high resistance region 30h is reduced. The oxygen ions cause a reaction with the oxide layer 32 in an oxygen deficient state outside the high resistance region 30h. The electrons possessed by the oxygen ions flow to the electrode layer 20. That is, the high resistance region 30h disappears, and the memory layer 30A returns to the low resistance state.

Thus, in the memory element 1, bidirectional (bipolar) voltage control is used to form and eliminate the high resistance region 30h near the electrode layer 20; thereby, information can be written and erased. For example, the state of the memory element 1 in the high resistance state is put as information "0". The state of the memory element 1 in the low resistance state is put as information "1".

Changing the memory element 1 from the high resistance state to the low resistance state is referred to as, for example, setting, and changing the memory element 1 from the low resistance state to the high resistance state is referred to as, for example, resetting. By repeating such a set operation and a reset operation, information can be written on the memory element 1 and information can be erased from the memory element 1.

To enhance the oxidation degree of the oxide layer 32 near the electrode layer 10, the movement of oxygen ions in the oxide layer 32 is necessary. In the memory element 1, to make it easy for oxygen ions to move, an oxygen deficient film, which has a lower oxygen concentration than the stoichiometric composition, is used as the oxide layer 32 that forms a current path. Since the high resistive oxide layers 31 are scattered in the memory layer 30A, it is easy for a current to be passed through the oxide layer 32.

Consequently, the high resistance region 30h can be effectively formed in the oxide layer 32 near the electrode layer 10. Thereby, in the memory element 1, the power consumption in the write operation and the erase operation is reduced.

In the memory element 1, part of the plurality of oxide layers 31 are in contact with at least one of the electrode layer 10 and the electrode layer 20. Consequently, the contact area between the oxide layer 32 and the electrode layer 10 (or the electrode layer 20) is reduced as compared to the case where the plurality of oxide layers 31 are not in contact with at least one of the electrode layer 10 and the electrode layer 20.

Therefore, the current path flowing from the oxide layer 32 to the electrode layer 10 is narrowed, and it becomes easy for the high resistance region 30h to be formed. Consequently, the power consumption in switching to a high resistance, that is, in forming the high resistance region 30h is reduced. Similarly, power consumption is reduced also in switching to a low resistance.

In the memory element 1, the elements contained in the oxide layers are selected so that the absolute value of the standard Gibbs free energy of formation of the oxide contained in the high resistive oxide layer 31 is larger than the absolute value of the standard Gibbs free energy of formation of the oxide contained in the low resistive oxide layer 32.

In the case of such a combination of materials, there is no case where the oxide layer 32 reduces the oxide layer 31, so that the oxygen concentration of the oxide layer 32 is increased. Therefore, the oxygen deficient state of the oxide layer 32 can be maintained. Consequently, the operating voltage of the memory layer 30A is stabilized, and the resistance value retention property is improved.

In the memory element 1, the elements contained in the oxide layers may be selected so that the absolute value of the standard Gibbs free energy of formation of the oxide contained in the high resistive oxide layer 31 is smaller than the absolute value of the standard Gibbs free energy of formation of the oxide contained in the low resistive oxide layer 32. In this case, it is easy for the low resistive oxide layer 32 to become high resistive. Therefore, also in this case, the operating voltage of the memory layer 30A is stabilized, and the resistance value retention property is improved.

The plurality of oxide layers 31 are formed by self alignment in which the oxide layer 31L is separated into a plurality of oxide layers 31 by heating treatment. That is, in the first embodiment, photolithography technology and etching process technology are not needed for the formation of the memory layer 30A. In other words, the manufacturing process according to the first embodiment is simple, and an increase in manufacturing costs is not caused.

In a filament-type resistance change element, the forming operation for forming a filament in a memory layer is generally needed. On the other hand, the forming operation is not needed in the memory element 1 according to the first embodiment.

Second Embodiment

Figure 5:
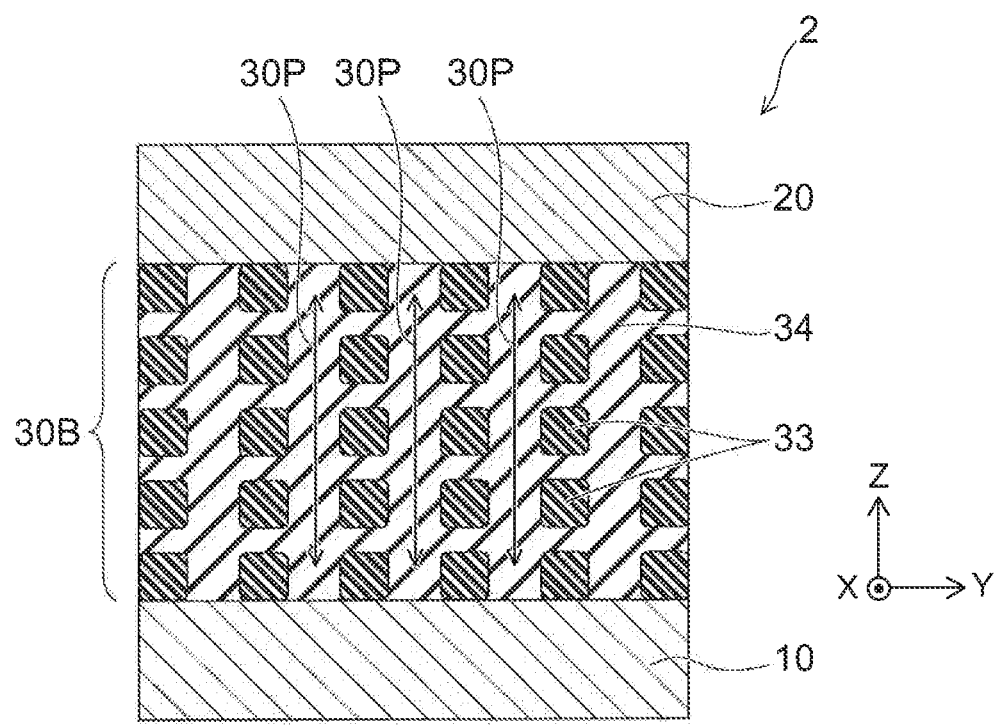
FIG. 5 is an example of a schematic cross-sectional view showing a memory element according to a second embodiment.

FIG. 5 is an example of a schematic cross-sectional view showing a memory element according to a second embodiment.

A memory element 2 according to the second embodiment includes the electrode layers 10 and 20 and a memory layer 30B. The memory layer 30B includes a plurality of oxide layers 33 and an oxide layer 34. Each of the plurality of oxide layers 33 includes a crystalline phase. The oxide layer 34 includes an amorphous phase. The crystallization temperature of the plurality of oxide layers 33 is lower than the crystallization temperature of the oxide layer 34. That is, the oxide layer 33 crystallizes more easily than the oxide layer 34.

Figure 6A:
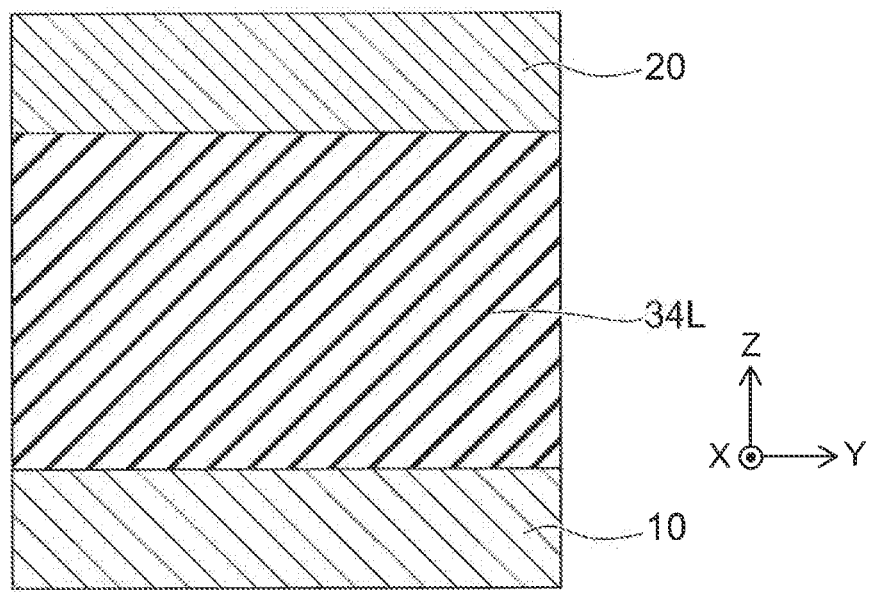
FIG. 6A and FIG. 6B are examples of schematic cross-sectional views showing a method for manufacturing a memory element according to the second embodiment.
Figure 6B:
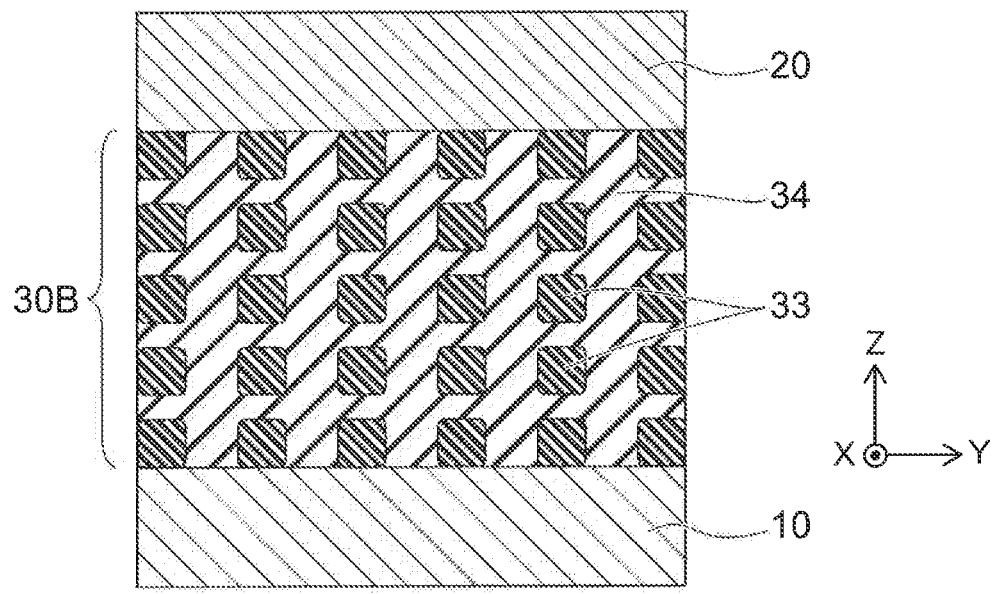

FIG. 6A and FIG. 6B examples of are schematic cross-sectional views showing a method for manufacturing a memory element according to the second embodiment.

First, as shown in FIG. 6A, an oxide layer 34L with a composition deviated from the stoichiometric composition is formed between the electrode layer 10 and the electrode layer 20. The oxide layer 34L contains an oxide having oxygen deficiency. The oxide layer 34L is amorphous.

Next, as shown in FIG. 6B, heating treatment is performed on the oxide layer 34L. Thereby, parts of the low crystallized material of the oxide layer 34L are crystallized to form a plurality of oxide layers 33. Thereby, the plurality of oxide layers 33 are formed as to be scattered in the oxide layer 34.

Thus, by using a material with a lower crystallization temperature than the oxide layer 34 and performing heating treatment on the oxide layer 34L at not less than the crystallization temperature of the oxide layer 33 and not more than the crystallization temperature of the oxide layer 34, the oxide layer 33 of a high resistance layer can be formed selectively in the oxide layer 34.

The oxide layer 33 or the oxide layer 34 contains an oxide of at least one element selected from the group consisting of hafnium (Hf), aluminum (Al), zirconium (Zr), titanium (Ti), silicon (Si), vanadium (V), tantalum (Ta), manganese (Mn), niobium (Nb), chromium (Cr), tungsten (W), molybdenum (Mo), cobalt (Co), nickel (Ni), and copper (Cu).

The oxide layer 33 and the oxide layer 34 may contain oxides of the same element. For example, the oxide layer 33 contains niobium pentoxide ($Nb_2O_5$) and the oxide layer 34 contains niobium dioxide ($NbO_2$).

In the memory element 2, a current path 30$p$ is formed in the region of the oxide layer 34 sandwiched by adjacent oxide layers 33. The oxide layer 33 is in a state of the stoichiometric composition or near the stoichiometric composition. Therefore, the oxide layer 33 is a high resistive metal oxide layer. On the other hand, the oxide layer 34 is in an oxygen deficient state, and is therefore a low resistive metal oxide layer. Since the oxygen in the oxide layer 34L has been reduced by the crystallization of the oxide layer 33, the oxygen concentration in the oxide layer 34 is lower than the oxygen concentration in the oxide layer 34L. Therefore, the oxide layer 34 in an amorphous state maintains the low resistance state.

Also the memory element 2 can be given a potential difference of a polarity whereby the electrode layer 10 becomes a higher potential, and can be given a potential difference of a polarity whereby the electrode layer 20 becomes a higher potential. Also in the memory element 2, the high resistance region 30$h$ is formed on the anode side, and the high resistance region 30$h$ is eliminated by the movement of oxygen ions and the Joule heat generated near the current path 30$p$. In other words, also in the memory element 2, the high resistance state and the low resistance state of the memory layer 30B can be created with good efficiency. Thus, the memory element 2 exhibits similar operation and effect to the memory element 1.

Third Embodiment

Figure 7:
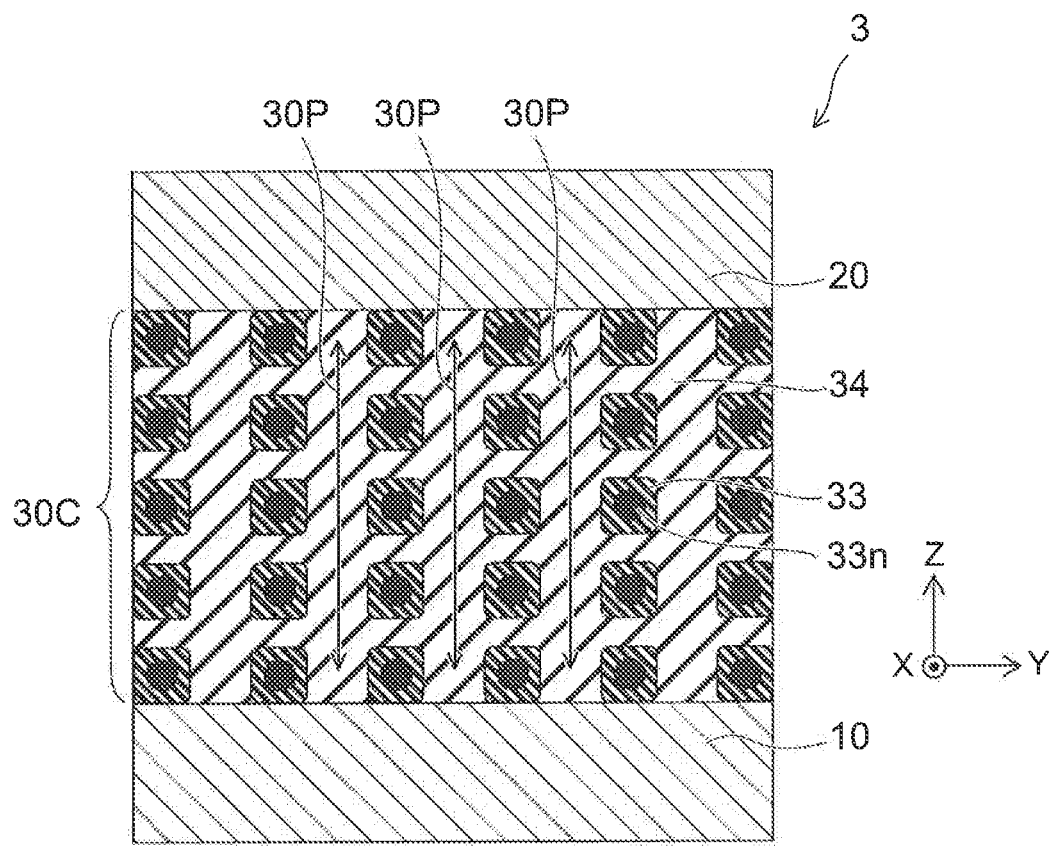
FIG. 7 is an example of a schematic cross-sectional view showing a memory element according to a third embodiment.

FIG. 7 is an example of a schematic cross-sectional view showing a memory element according to a third embodiment.

The basic structure of a memory element 3 according to the third embodiment is the same as the basic structure of the memory element 2. In addition, in the memory element 3, each of the plurality of oxide layers 33 includes a crystalline phase that is grown by using an impurity piece 33$n$ as a nucleus.

Figure 8A:
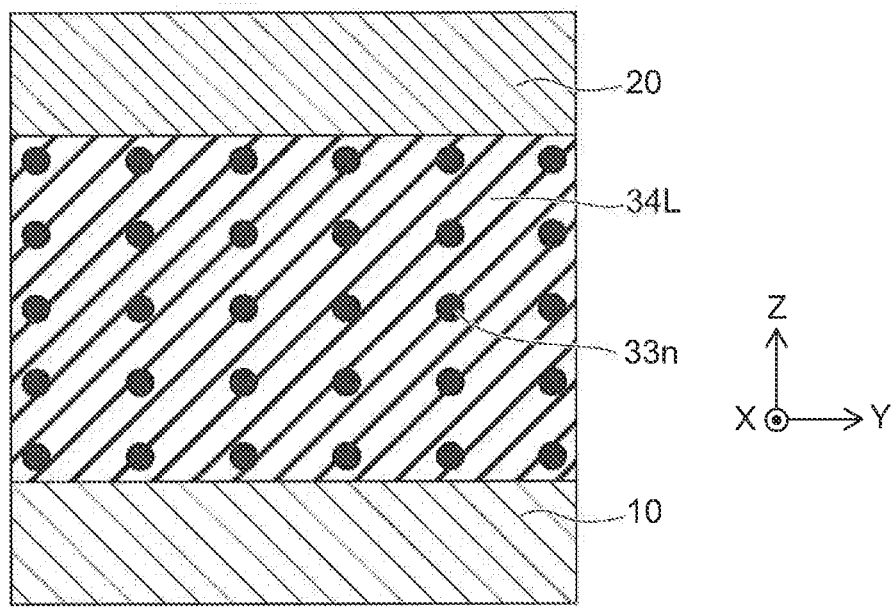
FIG. 8A and FIG. 8B are examples of schematic cross-sectional views showing a method for manufacturing a memory element according to the third embodiment.
Figure 8B:
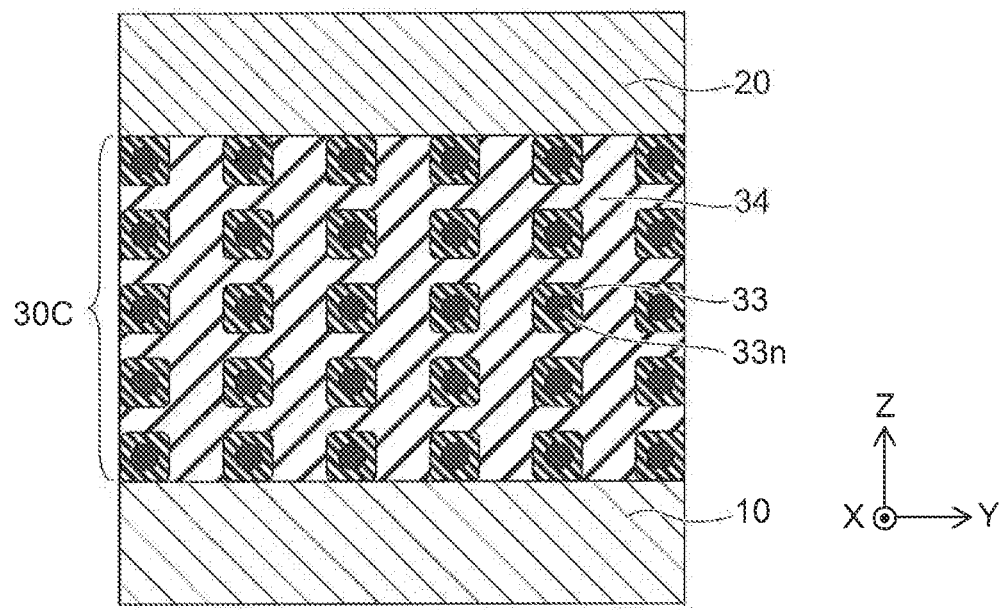

FIG. 8A and FIG. 8B are examples of schematic cross-sectional views showing a method for manufacturing a memory element according to the third embodiment.

First, as shown in FIG. 8A, the oxide layer 34L with a composition deviated from the stoichiometric composition is formed between the electrode layer 10 and the electrode layer 20. A plurality of impurity pieces 33$n$ are scattered in the oxide layer 34L.

The oxide layer 34L containing the plurality of impurity pieces 33$n$ is formed by the sputtering method using a metal oxide target containing an impurity, the two-dimensional sputtering method of a metal oxide target and an impurity target, a method of doping the oxide layer 34L with an impurity, or the like.

Next, as shown in FIG. 8B, heating treatment is performed on the oxide layer 34L. Thereby, parts of the oxide layer 34L are crystallized, and the parts form a plurality of oxide layers 33. Consequently, the plurality of oxide layers 33 each including a crystalline phase are scattered in the oxide layer 34.

In the crystallization, the oxide layer 33 grows by using the impurity piece 33$n$ as a nucleus. That is, the oxide layer 33 grows from the nucleus. By the concentration of impurity pieces 33$n$ being adjusted almost uniformly in the oxide layer 34L, the plurality of oxide layers 33 are arranged more uniformly in the oxide layer 34. Since the nucleus serving as a starting point of crystallization is present, the heating treatment temperature can be further reduced. Also in the third embodiment, similar effects to the first or second embodiment are obtained.

Fourth Embodiment

Figure 9A:
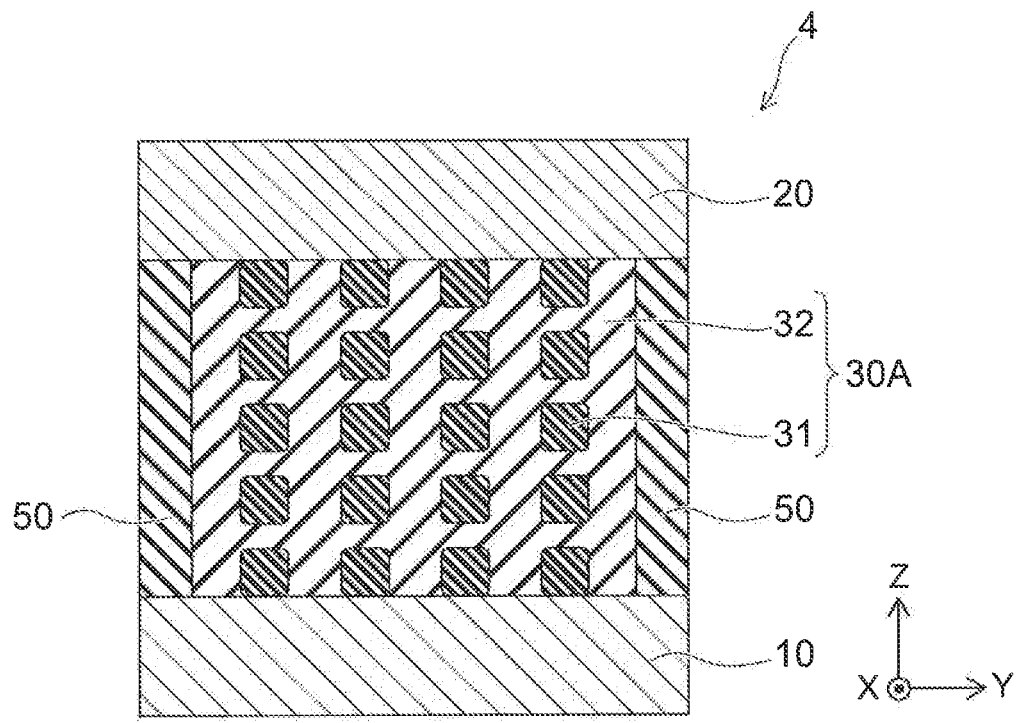
FIG. 9A is an example of a schematic cross-sectional view showing a memory element according to a first example of a fourth embodiment.
Figure 9B:
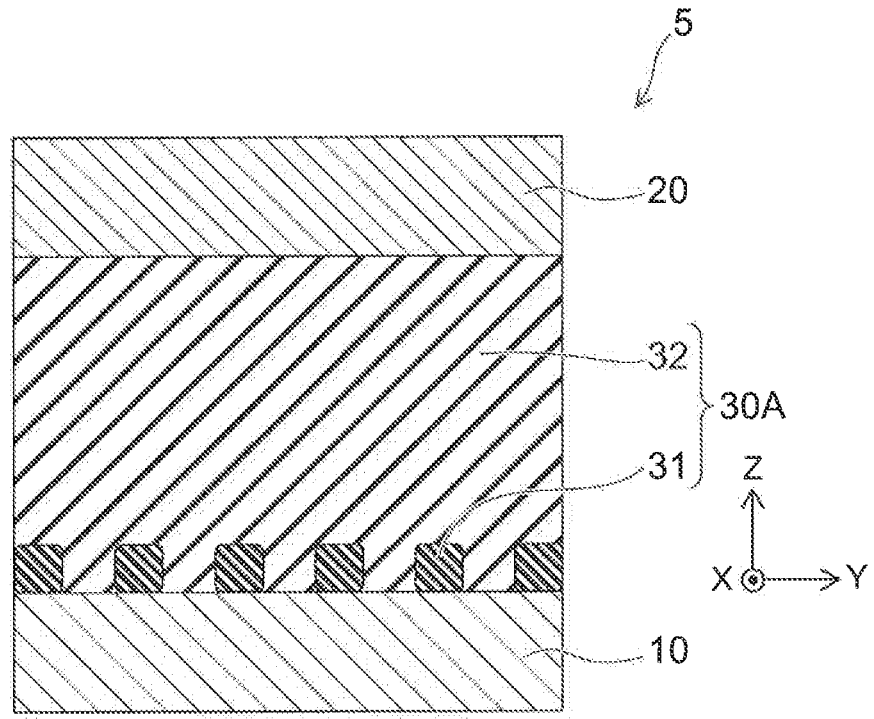
FIG. 9B is an example of a schematic cross-sectional view showing a memory element according to a second example of the fourth embodiment.

FIG. 9A is an example of a schematic cross-sectional view showing a memory element according to a first example of a fourth embodiment, and FIG. 9B is an example of a schematic cross-sectional view showing a memory element according to a second example of the fourth embodiment.

The basic structure of a memory element 4 shown in FIG. 9A is the same as the basic structure of the memory element 1. In addition, the memory element 4 further includes an oxide layer 50 (a third oxide layer) surrounding the side surface of the memory layer 30A.

The absolute value of the standard Gibbs free energy of formation of the oxide contained in the oxide layer 50 may be larger than the absolute value of the standard Gibbs free energy of formation of the oxide contained in each of the plurality of oxide layers 31 and the absolute value of the standard Gibbs free energy of formation of the oxide contained in the oxide layer 32. That is, the oxide layer 50 includes an oxide layer more stable than the oxide layers 31 and 32.

The memory cell array 100 includes a plurality of memory elements (FIG. 1C and FIG. 2). By the oxide layer 50 being provided in the memory element 4, the interference between the operations of adjacent memory elements 4 is suppressed. For example, by the oxide layer 50, the current flowing through the memory element 4 can be prevented from leaking to between memory elements. Thereby, the high resistance region 30$h$ can be reliably formed in a selected memory element 4, and a malfunction of another memory element 4 due to a leaking current can be prevented.

In addition to the structure in which a plurality of oxide layers 31 are three-dimensionally scattered in the oxide layer 32, also a structure in which a plurality of oxide layers 31 are arranged two-dimensionally on the electrode layer 10 side is included in the embodiment. For example, FIG. 9B illustrates a memory element 5 in which a plurality of oxide layers 31 are arranged two-dimensionally on the electrode layer 10 side. The plurality of oxide layers 31 are two-dimensionally arranged in contact with the electrode layer 10.

Also in such a structure, near the electrode layer 10, Joule heat is concentrated in the narrow region of the oxide layer 32 sandwiched by oxide layers 31. Oxygen ions move to the electrode layer 10 side due to an electric field, and obtain reaction energy from the Joule heat. Thereby, the reactivity between the oxygen ions and the oxide layer 32 near the electrode layer 10 is enhanced, and the oxidation reaction of the oxide layer 32 near the electrode layer 10 is promoted. Consequently, the high resistance region 30h can be formed near the electrode layer 10.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

The term "on" in "a portion A is provided on a portion B" refers to the case where the portion A is provided on the portion B such that the portion A is in contact with the portion B and the case where the portion A is provided above the portion B such that the portion A is not in contact with the portion B.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory element comprising:
   a first electrode;
   a second electrode facing the first electrode;
   a plurality of first oxide layers; and
   a second oxide layer,
   wherein:
      the plurality of first oxide layers are provided in the second oxide layer,
      the plurality of first oxide layers and the second oxide layer are provided in an area between the first electrode and the second electrode,
      a resistivity of each of the plurality of first oxide layers is higher than a resistivity of the second oxide layer, and
      a crystallization temperature of the plurality of first oxide layers is lower than a crystallization temperature of the second oxide layer.

2. The memory element according to claim 1, wherein an absolute value of a standard Gibbs free energy of formation of an oxide contained in each of the plurality of first oxide layers is larger than an absolute value of a standard Gibbs free energy of formation of an oxide contained in the second oxide layer.

3. The memory element according to claim 1, wherein each of the plurality of first oxide layers or the second oxide layer contains an oxide of at least one element selected from the group consisting of hafnium (Hf), aluminum (Al), zirconium (Zr), titanium (Ti), silicon (Si), vanadium (V), tantalum (Ta), manganese (Mn), niobium (Nb), chromium (Cr), tungsten (W), molybdenum (Mo), cobalt (Co), nickel (Ni), and copper (Cu).

4. The memory element according to claim 1, wherein part of the plurality of first oxide layers are in contact with at least one of the first electrode or the second electrode.

5. The memory element according to claim 1, wherein the plurality of first oxide layers include a crystalline phase and the second oxide layer includes an amorphous phase.

6. The memory element according to claim 1, wherein the plurality of first oxide layers and the second oxide layer contain oxides of the same element.

7. The memory element according to claim 1, wherein each of the plurality of first oxide layers includes a crystal layer, the crystal layer is grown by using an impurity piece scattered in the second oxide layer as a nucleus.

8. The memory element according to claim 1, further comprising a third oxide layer surrounding a side surface of the second oxide layer.

9. The memory element according to claim 1, wherein one of the plurality of first oxide layers is in contact with the first electrode.

10. The memory element according to claim 9, wherein another of the plurality of first oxide layers is apart from the first electrode.

11. The memory element according to claim 1, wherein the plurality of first oxide layers are provided discontinuously in a direction from the first electrode toward the second electrode.

12. A resistance change memory element comprising:
   a first electrode layer;
   a second electrode layer; and
   a memory layer provided between the first electrode layer and the second electrode layer, and the memory layer including a plurality of first oxide layers in a second oxide layer;
   a resistivity of each of the plurality of first oxide layers being higher than a resistivity of the second oxide layer,
   the plurality of first oxide layers including a crystalline phase, and
   the second oxide layer including an amorphous phase.

13. The resistance change memory element according to claim 12, wherein an absolute value of a standard Gibbs free energy of formation of an oxide contained in each of the plurality of first oxide layers is larger than an absolute value of a standard Gibbs free energy of formation of an oxide contained in the second oxide layer.

14. A resistance change memory comprising a memory cell, wherein
   the memory cell includes:
      a plurality of first oxide layers; and
      a second oxide layer;
      the plurality of first oxide layers are provided in the second oxide layer;
      a resistivity of each of the plurality of first oxide layers is higher than a resistivity of the second oxide layer, and
      each of the plurality of first oxide layers includes a crystal layer grown from an impurity piece scattered in the second oxide layer as a nucleus.

15. The resistance change memory according to claim 14, wherein the plurality of first oxide layers include a crystalline phase and the second oxide layer includes an amorphous phase.

16. The resistance change memory according to claim 14, wherein a crystallization temperature of the plurality of first oxide layers is lower than a crystallization temperature of the second oxide layer.

* * * * *